United States Patent [19]
Kodama

[11] Patent Number: 5,372,651
[45] Date of Patent: Dec. 13, 1994

[54] METHOD FOR CLEANING A SUBSTRATE

[75] Inventor: Hiroyuki Kodama, Yokohama, Japan

[73] Assignee: Nikon Corporation, Tokyo, Japan

[21] Appl. No.: 973,672

[22] Filed: Nov. 9, 1992

[30] Foreign Application Priority Data

Nov. 14, 1991 [JP] Japan ................. 3-297549

[51] Int. Cl.⁵ .................. B08B 3/04; B08B 3/12; C03C 23/00
[52] U.S. Cl. .................. 134/26; 134/1; 134/2; 134/6
[58] Field of Search ................ 134/1, 2, 6, 26

[56] References Cited

U.S. PATENT DOCUMENTS 4,569,695  2/1986  Yamashita et al. ............. 134/1
5,078,832  1/1992  Tanaka ......................... 134/1

FOREIGN PATENT DOCUMENTS 1-226156  9/1989  Japan .

Primary Examiner—Richard O. Dean
Assistant Examiner—Zeinab El-Arini
Attorney, Agent, or Firm—Shapiro and Shapiro

[57] ABSTRACT

A substrate cleaning method and equipment for removing foreign metters adhered to a substrate, the method comprising the steps of: making hydrophilic a surface of the substrate; causing pure water to diffusively permeate the hydrophilic surface of the substrate, thereby forming a layer of aqueous particles on the substrate surface; removing the foreign matters on the substrate in which the pure water diffusively permeated; and dipping, into hot pure water, the substrate in which the pure water diffusively permeated and then drying the substrate surface by relatively moving the hot water and the substrate.

7 Claims, 2 Drawing Sheets

METHOD FOR CLEANING A SUBSTRATE

BACKGROUND OF THE INVENTION

1. Field of the Invention

The present invention relates generally to a method and equipment for cleaning a substrate and, more particularly, to a substrate cleaning method and equipment for removing infinitesimal foreign matters (dusts, particles etc.) adhered to a glass substrate such as a photomask and a reticle for manufacturing a semiconductor.

2. Related Background Art

A line width of a pattern depicted on the surface of a semiconductor wafer substrate has become increasingly hyperfine. In the case of obtaining the hyperfine pattern by photolithography, if foreign matters such as dusts are adhered onto the photomask or the reticle, the foreign matters act as light shielding or scattering substances. In general, the circuit pattern is formed by opaque material like chromium, or phase shift material on the surface of a transparent substrate.

For this reason, the image of the foreign matters is transferred onto the wafer, and it follows that pattern different from the original mask pattern is formed on the wafer.

As a result, there exists a possibility in which an external configuration of the mask pattern is deteriorated, and further a defect on the circuit is caused. An undesirable influence by the deterioration of the external configuration increases when forming a higher integration of the circuit or a more hyperfine pattern. For this reason, the deterioration of the external configuration due to the infinitesimal foreign matters is not ignorable. Hence, an establishment of a method of substantially completely eliminating such foreign matters is of a high importance in terms of improving quality and yield of the product.

A conventional method and equipment for cleaning the photomask or the reticle are disclosed in U.S. Pat. No. 4,569,695. A brief explanation thereof will be given. The mask passes between a pair of rotary brushes while the surface and rear face of the mask are wetted with water or an electrolyte. Contaminations on the surface and rear face of the mask are thereby mechanically eliminated by the rotary brushes. The surface and rear face are rinsed with an organic solvent of an alcoholic system and thereafter dried in the steam of the alcoholic or freon system. A cleaning process is thus completed. This method is remarkably superior as a method of removing a foreign matter of 1 $\mu$m or larger.

Further, a method of cleaning the substrate surface after making it hydrophilic is known in Japanese Patent Laid-Open Application No. 1-226156. This cleaning method involves the steps of irradiating the substrate surface with ultraviolet light in an oxidative atmosphere containing oxygen to make the substrate surface hydrophilic. Thereafter, a water-containing layer is formed on the substrate surface. A cleaning liquid is brought into close contact with the substrate surface formed with the water-containing layer, thus cleaning the substrate surface. Thereafter, the cleaned substrate surface is dried.

As a result of extensive investigation by the present inventors, it has been determined that infinitesimal dusts produced from the rotary brushes in the first-mentioned technique are re-adhered onto the glass substrate, so that foreign matters still remain on the glass substrate after cleaning. Hence, a sufficient effect for removing foreign matters as infinitesimal as 1 $\mu$m or less was not necessarily obtained. It was also determined that in the second-mentioned technique, water stains appear after drying due to water that cannot be sufficiently removed in the drying step.

SUMMARY OF THE INVENTION

It is a primary object of the present invention, which has been devised in view of the problems described above, to provide a method and equipment for cleaning a glass substrate with no water stain and which are capable of surely removing foreign matters as infinitesimal as 1 $\mu$m or under and exhibiting a high-level cleaning ability.

It is another object of the present invention to enhance a permeability into a surface of the substrate so that the surface can be covered with a uniform water content (that is, the surface is uniformly moistened.)

It is still another object of the present invention to perform cleaning with no water stain by use of only oxygen of an active group and water, without employing harmful organic chemical substances at all.

According to the present invention, the surface of the glass substrate is made sufficiently hydrophilic by irradiating the glass substrate such as a photomask or a reticle with ultraviolet light. Then, pure water or hot pure water diffusively permeates the surface of the glass substrate. Thereafter, cleaning by brush scrubbing or ultrasonic waves is performed.

Then, after the cleaning has been executed, a pull-up drying process out of hot pure water is finally effected.

The foreign matters can be eliminated from the glass surface on the basis of the following principle by the method and equipment for cleaning the glass substrate according to the present invention.

When irradiating the glass surface with the ultraviolet rays, oxygen molecules (O$_2$) existing in close proximity to the glass substrate surface are changed into ozone molecules (O$_3$) by an energy of the ultraviolet rays. Further, the ozone molecules are decomposed by the energy of the ultraviolet rays or thermal energy, thereby generating an oxygen active group (O*) exhibiting high reactivity. This oxygen (O*) oxidizes and removes organic substances on the surface of the glass substrate. Simultaneously, the oxygen (O*) is coupled with Si—O—H group hydrogen atoms (H) on the glass substrate surface, thereby making the substrate surface hydrophilic. An interface energy on the hydrophilic surface is augmented, and a wetting property (permeability) of the water becomes remarkably large. The aqueous molecules (H$_2$O) diffusively permeate even hyperfine portions on the glass substrate. Cleaning action by brush scrubbing or ultrasonic waves with the aid of the water or hot water works at the highest efficiency in a state where the glass substrate surface is made hydrophilic, and the aqueous molecules diffusively permeate. The infinitesimal dusts existing on the glass substrate surface are all removed therefrom. Also, the glass surface is covered uniformly with the aqueous molecules, which makes it extremely difficult for localized residues of the water to be formed in the pull-up step. In consequence, A clean, dry surface with no water stain can be obtained.

BRIEF DESCRIPTION OF THE DRAWINGS

Other objects and advantages of the present invention will become apparent during the following discussion taken in conjunction with the accompanying drawings, in which.

DESCRIPTION OF THE PREFERRED EMBODIMENTS

Figure 1:
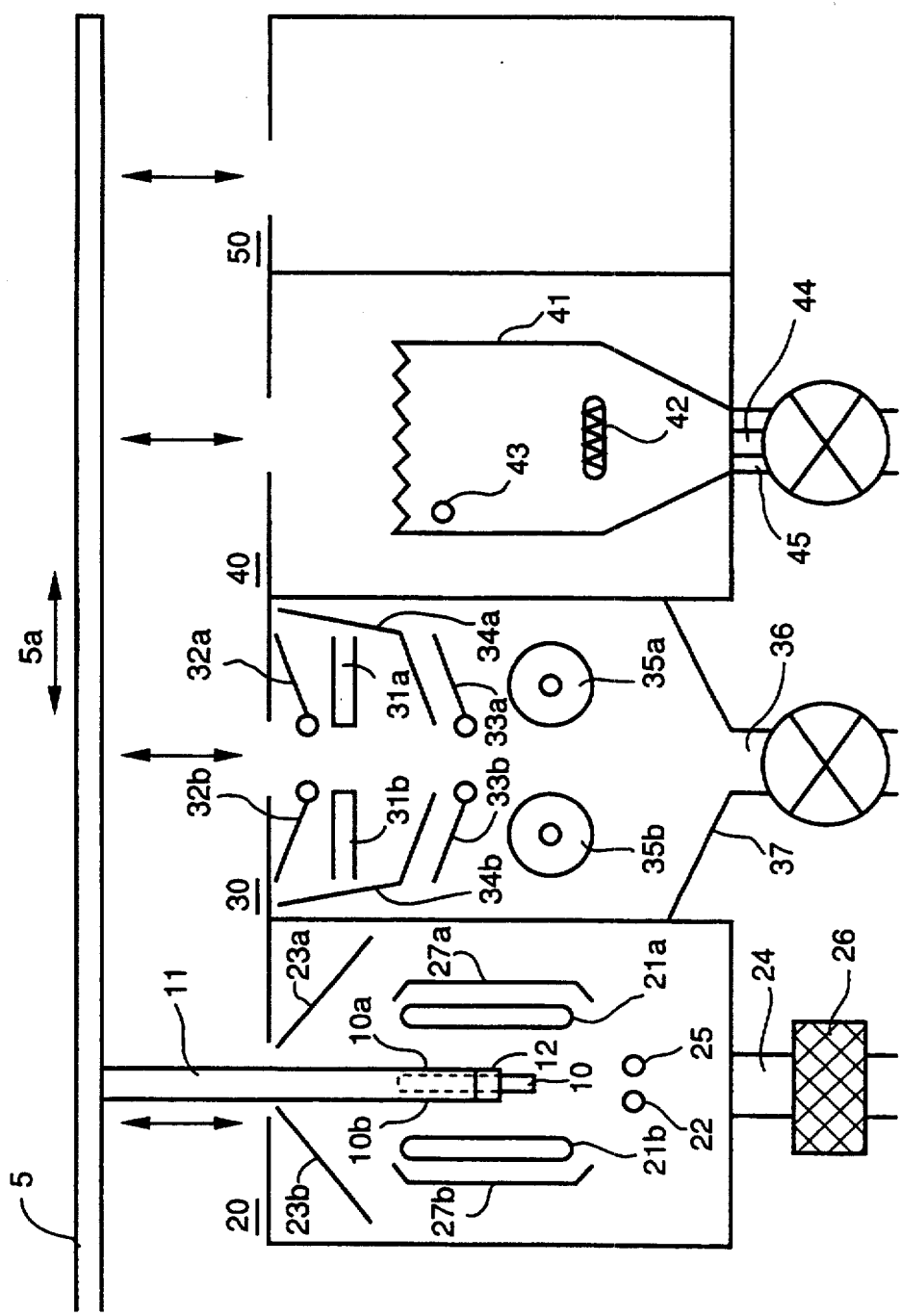
FIG. 1 is a schematic block diagram illustrating a glass substrate cleaning equipment in one embodiment of the present invention.

An embodiment of the present invention will be described with reference to the drawings. FIG. 1 is a schematic diagram illustrating an equipment of a preferred embodiment of the present invention for cleaning a glass substrate.

The cleaning equipment is, as illustrated in FIG. 1, constructed of: a housing unit 50 for housing a plurality of glass substrates 10; a first cleaning tank 20 for effecting hydrophilic processing of the glass substrate 10; a second cleaning tank 30 for performing pure water (hot pure water) cleaning of the glass substrate 10 by brush scrubbing or ultrasonic waves; a third cleaning tank (drying unit) 40 for drying the glass substrate 10 by dewatering the surface thereof; and a conveying system 5 capable of conveying the glass substrates to the respective cleaning tanks and vertically moving the glass substrates within the respective cleaning tanks.

Referring now to FIG. 1, the first cleaning tank 20 is disposed in the remotest position from the housing unit 50. The second and third cleaning tanks are disposed sequentially from the first cleaning tank 20 towards the housing unit 50. Note that the first, second and third cleaning tanks 20, 30, 40 are sequentially disposed along a rectilinear conveying route 5a for conveying the glass substrates 10 to the respective cleaning tanks. The tanks need not necessarily be disposed rectilinearly from the first cleaning tank 20 to the housing unit 50, however. For instance, the first cleaning tank 20 and the third cleaning tank 40 may be placed adjacently to the housing unit 50.

Figure 2A:
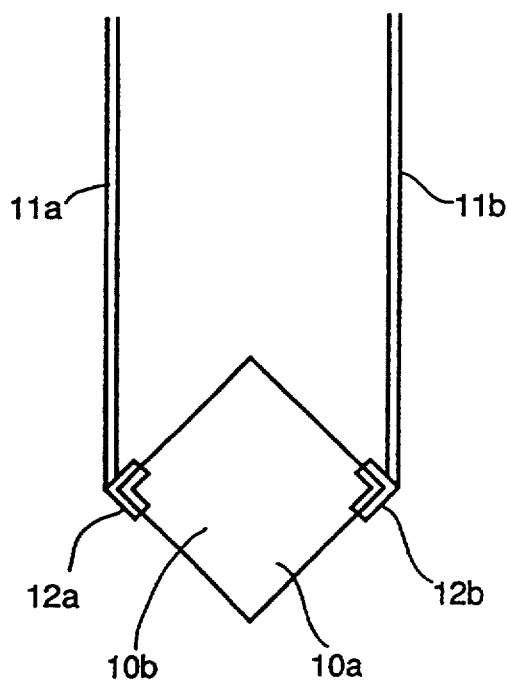
FIGS. 2A and 2B are schematic diagrams depicting conveying arms in the equipment of FIG. 1.
Figure 2B:
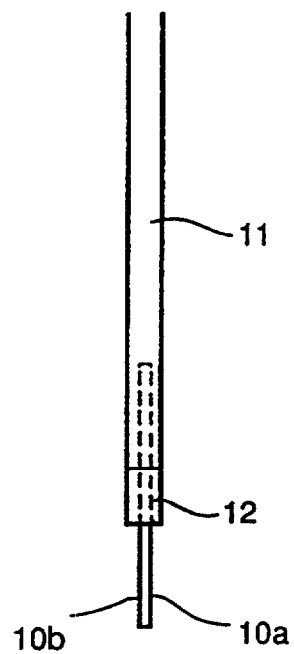

Turning to FIGS. 2A and 2B, holding portions 12a, 12b of two conveying support members (arms) 11a, 11b hold two corners, disposed in the direction of a diagonal line, of the glass substrate 10 to be cleaned. The glass substrate 10 is thus held obliquely such that all peripheral edges of the substrate are inclined with respect to a vertical direction. The oblique holding of the glass substrate 10 is intended to make dewatering better. The arms 11a, 11b constitute a vertically movable structure. The arms bring in and out the glass substrates between the housing unit 50 and the respective cleaning tanks 20, 30, 40. Further, the arms move the glass substrates 10 between the respective cleaning tanks and the conveying system 5.

The glass substrate 10 is held and conveyed at a right angle to the moving direction. When moved in each tank during cleaning, the glass substrate 10 is conveyed in such way that a pattern surface 10b of the glass substrate 10 is directed forwards, while a glass surface 10a is directed backwards before being processed in each tank. Conversely, after being processed, the glass surface 10a of the glass substrate 10 is directed forwards, while the pattern surface 10b is directed backwards. This takes into consideration both miniaturization of the equipment and an influence of adhesion of contaminants if adhered during the conveyance.

Referring now to FIG. 1, the cleaning tank 20 is constructed of: UV lamps 21a, 21b for emitting UV rays with which the glass substrate is irradiated; an ozone monitor 22 for monitoring the ozone generated when the glass substrate 10 is irradiated with the UV rays; UV light shielding plates 23a, 23b for preventing direct rays and reflected rays of the UV lamp from leaking outside; an ozone exhaust 24; a UV irradiation quantity monitor 25; an ozone adsorbent 26; and UV ray reflectors 27a, 27b. The UV lamps 21a, 21b are disposed opposite to each other so that glass substrate 10 is situated therebetween. The UV ray reflectors 27a, 27b are so disposed that the UV rays uniformly fall on the glass substrate. A UV ray irradiation quantity is measured and controlled by the UV ray quantity monitor 25.

The ozone ($O_3$) generated is measured and controlled by the ozone monitor 22 and exhausted via the ozone exhaust 24 formed under the tank so as not to leak outside. Note that the ozone during the exhaust is adsorbed and removed by use of the ozone adsorbent 26 provided en route to an exhaust system. The ozone is discharged with a safe concentration. A wavelength of the UV light incident on the glass substrate 10 is set suitably so as to make the glass substrate 10 hydrophilic. In accordance with this embodiment, the glass substrate 10 composed of Si—O is irradiated with the UV light having a wavelength of 250 nm or shorter. This irradiation of the UV rays makes the glass substrate surface sufficiently hydrophilic.

The second cleaning tank 30 consists of: injection type ultrasonic oscillators 31a, 31b; pure water shower nozzles 32a, 32b, 33a, 33b; splash preventive plates 34a, 34b; rotary brushes 35a, 35b; and a drain port 36. Installed at respective equal distances from the top of the cleaning tank 30 are the pure water shower nozzles 32a, 32b, the injection ultrasonic oscillators 31a, 31b; the pure water shower nozzles 33a, 33b and the rotary brushes 35a, 35b, whereby the glass substrate 10 can be disposed therebetween. These members are located to eliminate foreign matters most effectively.

The splash preventive plates 34a, 34b are interposed between the injection ultrasonic oscillators 31a, 31b and the pure water shower nozzles 33a, 33b, thereby preventing a re-adhesion of the foreign matters to the glass substrate 10 during cleaning by the ultrasonic wave and brush scrubbing.

The drain port and a tank bottom 37 take an oblique structure to maximize a recovery efficiency of the waste liquid. Further, the pure water showers 32a, 32b and the pure water showers 33a, 33b are capable of jetting hot pure water as needed. If an electrostatic charge to the glass substrate 10 is caused, the showers are capable of supplying the water dissolved with $CO_2$ (carbonic acid gas). Note that a cleaning effect is enhanced by use of the hot pure water.

The third cleaning tank 40 comprises a quartz glass tank 41, a heater 42 for heating the hot pure water, particles (which mainly comprise removed foreign matters) measuring device 43, a hot pure water supply port 44 and a hot pure water drain port 45. These components are structured such that the foreign matters are not re-adhered to the glass substrate 10, and a cleaning degree and a temperature of the hot pure water are maintained and controlled so as not to produce water stains. More specifically, with respect to maintaining the cleaning degree (efficiency), the quartz glass tank 41 composed of the quartz glass having a low contamination is employed as a tank for drying the glass substrate. An overflow of the hot pure water is always effected in a configuration with a small amount of residual foreign matters. At the same time, the particle measuring device 43 measures the number of particles existing in the hot pure water and performs the control so that the number of particles does not exceed a predetermined number. Speaking of the temperature, the heater 42 for heating the hot pure water constantly controls an energy supply quantity so as not to cause fluctuations in the temperature of the hot pure water.

Next, the cleaning operation will be explained.

[Step 1]

The glass substrate 10 is conveyed via the conveying system 5 to the first cleaning tank 20 remotest from the housing unit 50. The glass substrate 10 conveyed to the first cleaning tank 20 is shifted to a predetermined position in the first cleaning tank 20 by means of the arms 11a, 11b. Before insertion of the glass substrate 10, the first cleaning tank 20 assumes an idling status wherein a lamp intensity drops down. After inserting the glass substrate 10, however, the lamp intensity reaches the maximum (Full), whereby an intensive irradiation state of the UV rays is developed. A UV irradiation light quantity is measured by the UV irradiation light quantity monitor 25. The ozone generated is measured by the ozone monitor 21. A necessary quantity of UV irradiation is effected. The ozone generated at this moment is exhausted with the safety concentration from the lower ozone exhaust 24 through the ozone adsorbent 26.

[Step 2]

The glass substrate 10 exhibiting the sufficient hydrophilic property owing to the irradiation of the UV rays in [Step 1] is conveyed via the conveying system 5 to the second cleaning tank 30. The glass substrate 10 is moved in the vicinity of the hot water shower nozzles 32a, 32b by the arms 11a, 11b. The glass substrate 10 is at first rinsed therein with pure water or hot pure water through the hot water shower nozzles 32a, 32b. The entire surface of the glass substrate is wetted with the pure water or hot pure water uniformly. The glass substrate 10 is sufficiently made hydrophilic, and, as stated earlier, the aqueous molecules diffusively permeate the glass substrate 10. Thereafter, the arms 11a, 11b shift the glass substrate 10 in the vicinity of the rotary brushes 35a, 35b. Then, the glass substrate undergoes scrub cleaning by the rotary brushes 35a, 35b while jetting the pure water or hot pure water from the pure water shower nozzles 33a, 33b. The glass substrate 10 is repeatedly stroke-operated in the up-and-down directions, thus effecting the scrub cleaning over the entire surface of the glass substrate 10. At this time, the rotary brushes 35a, 35b rotate in such a direction as to scrub the glass substrate 10 from top to bottom. After stopping of the rotary brushes, subsequently, the arms 11a, 11b shift the glass substrate 10 in the vicinity of the injection ultrasonic oscillators 31a, 31b. Then, the entire surface of the glass substrate 10 is, as similar to brush scrubbing, subjected to ultrasonic cleaning by use of the injection ultrasonic oscillators 31a, 31b. Finally, a finish rinse is effected thereon with the pure water or hot pure water through the pure water shower nozzles 32a, 32b.

[Step 3]

The glass substrate 10 from which the foreign matters are removed is conveyed via the conveying system 5 to the third cleaning tank 40. The arms 11a, 11b cause the glass substrate 10 to dip into the hot pure water within the quartz glass tank 41. Jush when a temperature of the glass substrate is equalized to a temperature of the hot pure water, the glass substrate is pulled up from the liquid at a speed as low as 2-10 mm/sec. As explained earlier, the surface of the glass substrate 10 is covered with the aqueous molecules, whereby drying with no water stain is attainable.

[Step 4]

The glass substrate 10 dried and clean after being pulled up is conveyed via the conveying system 5 to the housing unit 50, thus finishing the cleaning process.

In accordance with the embodiment discussed above, the hydrophilic process of the glass substrate is performed by the irradiation of the UV rays. It was empirically confirmed that ozone ($O_3$) processing other than the irradiation of the UV rays is also effective as a method of making hydrophilic the surface of the glass substrate.

The following is a brief explanation of the ozone processing. In the embodiment discussed above, the ozone molecules are generated by the irradiation of the UV rays, and oxygen ($O^*$) of an active group is produced. In the ozone processing, however, oxygen ($O^*$) of the active group is produced by directly supplying the ozone molecules and thermal energy without executing the irradiation of the UV rays.

Although the illustrative embodiments of the present invention have been described in detail with reference to the accompanying drawings, it is to be understood that the present invention is not limited to those embodiments. Various changes or modifications may be effected by one skilled in the art without departing from the scope or spirit of the invention.

What is claimed is:

1. A cleaning method for removing foreign matter adhered to a surface of a glass substrate, comprising the steps of:

making said surface of said glass substrate hydrophilic;

showering said hydrophilic surface with pure water supplied from shower means to cause the pure water to diffusively permeate said hydrophilic surface and form a layer of aqueous molecules thereon;

removing foreign matter from said permeated surface; and thereafter dipping said glass substrate into a bath of hot pure water and drying said surface by relatively moving said bath and said substrate.

2. The glass substrate cleaning method according to claim 1, wherein said surface is made hydrophilic by supplying oxygen of an active group to said surface.

3. The glass substrate cleaning method according to claim 2, wherein oxygen of the active group is supplied by an irradiation of ultraviolet rays.

4. The glass substrate cleaning method according to claim 1, wherein said pure water supplied from said shower means is hot pure water.

5. The glass substrate cleaning method according to claim 1, wherein said drying step includes detecting both a temperature of said hot pure water and a temperature of said substrate and starting said relative movement just when the temperature of said substrate is equalized to the temperature of said hot pure water.

6. The glass substrate cleaning method according to claim 1, wherein said removing step includes brushing said glass substrate.

7. The glass substrate cleaning method according to claim 1, wherein said relative movement of said bath and said substrate is effected such that said substrate is removed from said bath at a rate of 2-10 mm/sec.

* * * * *